United States Patent
Fang et al.

(10) Patent No.: US 10,984,588 B2
(45) Date of Patent: Apr. 20, 2021

(54) OBSTACLE DISTRIBUTION SIMULATION METHOD AND DEVICE BASED ON MULTIPLE MODELS, AND STORAGE MEDIUM

(71) Applicant: Baidu Online Network Technology (Beijing) Co., Ltd., Beijing (CN)

(72) Inventors: Jin Fang, Beijing (CN); Feilong Yan, Beijing (CN); Feihu Zhang, Beijing (CN); Ruigang Yang, Beijing (CN); Liang Wang, Beijing (CN); Yu Ma, Beijing (CN)

(73) Assignee: Baidu Online Network Technology (Beijing) Co., Ltd, Beijing (CN)

( * ) Notice: Subject to any disclaimer, the term of this patent is extended or adjusted under 35 U.S.C. 154(b) by 0 days.

(21) Appl. No.: 16/511,783

(22) Filed: Jul. 15, 2019

(65) Prior Publication Data
US 2020/0082619 A1    Mar. 12, 2020

(30) Foreign Application Priority Data
Sep. 7, 2018  (CN) .......................... 201811044615.9

(51) Int. Cl.
| | | |
|---|---|---|
| G06T 17/20 | (2006.01) | |
| G06K 9/00 | (2006.01) | |
| G06T 7/70 | (2017.01) | |

(52) U.S. Cl.
CPC .......... G06T 17/20 (2013.01); G06K 9/00671 (2013.01); G06K 9/00805 (2013.01);
(Continued)

(58) Field of Classification Search
None
See application file for complete search history.

(56) References Cited

U.S. PATENT DOCUMENTS

| | | |
|---|---|---|
| 8,611,585 B2 | 12/2013 | Zhang et al. |
| 9,082,014 B2 | 7/2015 | Terrazas et al. |
| | (Continued) | |

FOREIGN PATENT DOCUMENTS

| | | |
|---|---|---|
| CN | 101441076 A | 5/2009 |
| CN | 102663196 A | 9/2012 |
| | (Continued) | |

OTHER PUBLICATIONS

Berro et al., Fusing Lidar and Semantic Image Information in Octree Maps, 2017, researchgate.net (Year: 2017).*
(Continued)

*Primary Examiner* — YuJang Tswei
(74) *Attorney, Agent, or Firm* — Patterson Thuente Pedersen, P.A.

(57) ABSTRACT

An obstacle distribution simulation method, device and terminal based on multiple models. The method can include: acquiring a point cloud, the point cloud including a plurality of obstacles labeled with real labeling data; extracting the real labeling data of the obstacles, and training a plurality of neural network models based on the real labeling data of the obstacles; extracting unlabeled data in the point cloud, inputting the unlabeled data into the neural network models, and outputting a plurality of prediction results. The plurality of prediction results can include a plurality of simulated obstacles with attribute data; selecting at least one simulated obstacle based on the plurality of prediction results; and inputting the attribute data of the selected simulated obstacle into the neural network models to obtain position coordinates of the simulated obstacle, and further obtain a position distribution of the simulated obstacle.

8 Claims, 4 Drawing Sheets

(52) U.S. Cl.
CPC ...... *G06T 7/70* (2017.01); *G06T 2207/20081* (2013.01); *G06T 2207/30261* (2013.01); *G06T 2210/12* (2013.01)

(56) References Cited

U.S. PATENT DOCUMENTS

| | | | |
|---|---|---|---|
| 9,760,806 B1 | 9/2017 | Ning et al. | |
| 9,812,838 B2 | 11/2017 | Villeneuve et al. | |
| 10,304,191 B1* | 5/2019 | Mousavian | G06T 7/70 |
| 2005/0249391 A1* | 11/2005 | Kimmel | G06T 7/11 382/128 |
| 2010/0086200 A1* | 4/2010 | Stankiewicz | G06Q 10/101 382/154 |
| 2017/0092000 A1 | 3/2017 | Schwimmer | |
| 2017/0261318 A1 | 9/2017 | Takagi et al. | |
| 2017/0262735 A1* | 9/2017 | Ros Sanchez | G06K 9/481 |
| 2018/0028294 A1* | 2/2018 | Azernikov | G06K 9/6274 |
| 2018/0053401 A1* | 2/2018 | Martin | H04W 4/90 |
| 2018/0188059 A1* | 7/2018 | Wheeler | B60W 40/04 |
| 2018/0232639 A1* | 8/2018 | Lin | G06N 3/08 |
| 2018/0233142 A1* | 8/2018 | Koishida | A61B 5/7475 |
| 2018/0348343 A1* | 12/2018 | Achour | H01Q 3/44 |
| 2018/0349526 A1* | 12/2018 | Atsmon | G09B 9/54 |
| 2018/0373980 A1* | 12/2018 | Huval | G06K 9/00805 |
| 2019/0056735 A1* | 2/2019 | Koopman | G05D 1/0077 |
| 2020/0033866 A1* | 1/2020 | Song | B60W 50/06 |
| 2020/0057442 A1* | 2/2020 | Deiters | G05D 1/0246 |

FOREIGN PATENT DOCUMENTS

| | | |
|---|---|---|
| CN | 103258338 A | 8/2013 |
| CN | 103914830 A | 7/2014 |
| CN | 104020674 A | 9/2014 |
| CN | 104331910 A | 11/2014 |
| CN | 104183014 A | 12/2014 |
| CN | 104376297 A | 2/2015 |
| CN | 104457569 A | 3/2015 |
| CN | 104899855 A | 9/2015 |
| CN | 104933708 A | 9/2015 |
| CN | 104950883 A | 9/2015 |
| CN | 105761308 A | 7/2016 |
| CN | 105844600 A | 8/2016 |
| CN | 105957145 A | 9/2016 |
| CN | 106204457 A | 12/2016 |
| CN | 106462757 A | 2/2017 |
| CN | 106599832 A | 4/2017 |
| CN | 106845412 A | 6/2017 |
| CN | 106919908 A | 7/2017 |
| CN | 106997049 A | 8/2017 |
| CN | 107103627 A | 8/2017 |
| CN | 107657237 A | 2/2018 |
| CN | 107659774 A | 2/2018 |
| CN | 107678306 A | 2/2018 |
| CN | 107818293 A | 3/2018 |
| CN | 107832806 A | 3/2018 |
| CN | 107993512 A | 5/2018 |
| CN | 108010360 A | 5/2018 |
| CN | 108156419 A | 6/2018 |
| CN | 108256506 A | 7/2018 |
| CN | 108492356 A | 9/2018 |
| JP | WO 2012/001755 A1 | 8/2013 |
| JP | 2015079223 A | 4/2015 |
| JP | 2017091273 A | 5/2017 |
| JP | 2018060511 A | 4/2018 |
| JP | 2018060512 A | 4/2018 |
| KR | 20160047087 A | 5/2016 |
| RO | 132599 A2 | 5/2018 |
| TW | 200945245 A | 11/2009 |
| TW | 201643063 A | 12/2016 |
| WO | WO2018/138584 A1 | 8/2018 |

OTHER PUBLICATIONS

Extended European Search Report, Application No. 19185805.9, dated Jan. 31, 2020, 8 pages.

Xiangyu Yue et al., "A LiDAR Point Cloud Generator: from a Virtual World to Autonomous Driving," ARXIV: 1804.00103V1, arxiv.org, Cornell University Library, 201 Olin Library Cornell University Ithaca, NY 14853, Mar. 31, 2018, XP081225058, Retrieved from Internet: URL: https://arxiv.org/abs/1804.00103, 7 pages.

Extended European Search Report, Application No. 19185780.4, dated Feb. 11, 2020, 10 pages.

Christopher Gustav Keller et al., "Real-time recognition of U.S. speed signs," Intelligent Vehicles Symposium, 2008 IEEE, IEEE, Piscataway, NJ, USA, Jun. 4, 2008, pp. 518-823, XP031318927, ISBN: 978-1-4244-2568-6.

CN Application No. 201811044615.9, First Office Action dated Aug. 22, 2019, 7 pages.

CN Application No. 201811044615.9, Search Report dated Aug. 18, 2019, 4 pages.

CN Application No. 201811044639.4, First Office Action dated Aug. 5, 2019, 5 pages.

CN Application No. 201811044639.4, Search Report dated Jul. 25, 2019, 4 pages.

Notice of Reasons for Refusal dated Sep. 23, 2020 for Japanese Application No. 2019-133666, 8 pages.

* cited by examiner

OBSTACLE DISTRIBUTION SIMULATION METHOD AND DEVICE BASED ON MULTIPLE MODELS, AND STORAGE MEDIUM

CROSS-REFERENCE TO RELATED APPLICATION

This application claims priority to Chinese Patent Application No. 201811044615.9, filed on Sep. 7, 2018, which is hereby incorporated by reference in its entirety.

TECHNICAL FIELD

The present disclosure relates generally to obstacle detection, and in particular to an obstacle distribution simulation method and device based on multiple models, and a computer readable storage medium therefor.

BACKGROUND

High-precision three-dimensional (3D) maps can be annotated with data labeling obstacles in the map. This data can be collected in an offline state of the high-precision map. This labeling, or annotation, data can include a position indicating where an obstacle is currently located, an orientation, an identifier (ID) a type of the obstacle, and the like. The obstacle types can include dynamic obstacles such as a vehicles, pedestrians or bicycle riders, and static obstacles such as traffic cones or pylons. The question of how to simulate or model the number of obstacles and the position distribution of the obstacles so as to resemble the real conditions as much as possible is drawing more and more attention from those skilled in the art.

In existing technical solutions, simulation is typically performed by using a regular (or rule-based) arrangement of obstacles with the aid of a high-precision map. Examples of regular arrangement of obstacles might include arrangements of vehicles in a generally parallel to a lane, and random arrangements of pedestrians. However, very limited scenarios can be presented based on regular arrangement of obstacles. Since the high-precision maps often include only main roads, without side roads or branch roads, a simulated result of the position distribution of the same types of obstacles and a simulated result of the number distribution of different types of obstacles can greatly differ from real conditions. In addition, the regular arrangement of obstacles cannot present all the possible cases in a real scenario in an exhaustive manner, resulting in low coverage.

SUMMARY OF THE DISCLOSURE

According to embodiments of the present disclosure, a multiple-model based obstacle distribution simulation method, device and terminal are provided, to solve at least the above technical problems in the existing technologies.

In a first aspect, an obstacle distribution simulation method based on multiple models can include acquiring a point cloud including a plurality of obstacles labeled with real labeling data. The point cloud can be based on a plurality of imaging frames. The real labeling data of the obstacles can be extract, and a plurality of neural network models can be trained based on the real labeling data of the obstacles.

Unlabeled data in the point cloud can be extracted and input into the neural network models. A plurality of prediction results, which can include a plurality of simulated obstacles with attribute data can be output.

At least one simulated obstacle can be selected based on the plurality of prediction results. The attribute data of the selected simulated obstacle can be input into the plurality of neural network models to obtain position coordinates of the simulated obstacle, and further obtain a position distribution of the simulated obstacle.

In embodiments, the method can further include outputting confidences corresponding to the respective prediction results determining whether the confidences are greater than a threshold, and reserving, retaining, or outputting a the prediction results that have a confidence greater than the threshold.

Selecting at least one simulated obstacle based on the plurality of prediction results can include determining whether the plurality of prediction results include a common same simulated obstacle, and selecting the same simulated obstacle in a case that the plurality of prediction results include the same simulated obstacle.

In embodiments, inputting the attribute data of the selected simulated obstacle into the neural network models to obtain position coordinates of the simulated obstacle can include inputting the attribute data of the selected simulated obstacle into the neural network models to obtain a plurality of boundary boxes of the simulation obstacle, obtaining lengths and widths of the boundary boxes of the simulated obstacles, calculating an average length value and an average width value based on the lengths and the widths of the boundary boxes, and obtaining center coordinates of an average boundary box based on the average length value and the average width value to cause the central coordinates to be represented as position coordinates of the simulated obstacle.

In a second aspect, according to an embodiment of the present disclosure, an obstacle distribution simulation device based on multiple models is provided. The device can include a point cloud acquisition module, configured to acquire a point cloud based on a plurality of frames, the point cloud including a plurality of obstacles labeled by real labeling data. A model training module can be configured to extract the real labeling data of the obstacles, and train a plurality of neural network models based on the real labeling data of the obstacles. A simulated obstacle prediction module can be configured to extract unlabeled data in the point cloud, input the unlabeled data into the neural network models, and output a plurality of prediction results, wherein the plurality of prediction results include a plurality of simulated obstacles with attribute data. A simulated obstacle selection module can be configured to select at least one simulated obstacle based on the plurality of prediction results. A simulated obstacle position distribution module can be configured to input the attribute data of the selected simulated obstacle into the neural network models to obtain position coordinates of the simulated obstacle, and further obtain a position distribution of the simulated obstacles.

In embodiments, the device can further include a confidence determination module configured to output confidences corresponding to the respective prediction results, determine whether the confidences are greater than a threshold, and reserve or retain a prediction result with a confidence greater than the threshold.

In embodiments, the simulated obstacle position distribution module can include, a boundary box calculation unit, configured to input the attribute data of the selected simulated obstacle into the neural network models to obtain a plurality of boundary boxes of the simulation obstacle, a length and width calculation unit, configured to obtain lengths and widths of the boundary boxes of the simulation obstacle, an average length and width value calculation unit, configured to calculate an average length value and an average width value based on the lengths and the widths of the boundary boxes; and a position coordinate calculation unit, configured to obtain center coordinates of an average boundary box based on the average length value and the average width value, to cause the center coordinates to be represented as position coordinates of the simulated obstacle.

In a third aspect, according to an embodiment of the present disclosure, an obstacle distribution simulation terminal based on multiple models is provided. The terminal can include: a processor and a memory for storing a program which supports the obstacle distribution simulation device based on multiple models in executing the obstacle distribution simulation method based on multiple models described above in the first aspect, and the processor is configured to execute the program stored in the memory. The terminal can further include a communication interface for enabling the terminal to communicate with other devices or communication networks.

The functions may be implemented by using hardware or by executing corresponding software by hardware. The hardware or software includes one or more modules corresponding to the functions described above.

In a fourth aspect, according to an embodiment of the present disclosure, a non-transitory, computer-readable storage medium is provided for storing computer software instructions used for an obstacle distribution simulation device based on multiple models, the computer readable storage medium including a program involved in executing the obstacle distribution simulation method based on multiple models described above in the first aspect by the obstacle distribution simulation device based on multiple models.

Any one of the above technical solutions can have the following advantages or advantageous effects. By extracting the real labeling data of the obstacles to training the neural network models, simulated obstacles can be predicted using the unlabeled data and the neural network models, and a position distribution of the predicted simulated obstacles can be calculated. The position diversity of the simulated obstacles is increased, such that simulation results of the position distribution of the obstacles and the number distribution of the obstacles are closer to real conditions.

The above summary is provided only for illustration, and is not intended to limit the present disclosure in any way. In addition to the illustrative aspects, embodiments and features described above, further aspects, embodiments and features of the present disclosure may be readily understood from the following detailed description with reference to the accompanying drawings.

BRIEF DESCRIPTION OF THE DRAWINGS

Unless otherwise specified, identical or similar parts or elements are denoted by identical reference signs throughout several figures of the accompanying drawings. The drawings are not necessarily drawn to scale. It should be understood that these drawings merely illustrate some embodiments of the present disclosure, and should not be construed as limiting the scope of the disclosure.

DETAILED DESCRIPTION

Hereinafter, only some example embodiments are described. As can be appreciated by those skilled in the art, the described embodiments may be modified in various different ways without departing from the spirit or scope of the present disclosure. Accordingly, the drawings and the description should be considered as illustrative in nature instead of being restrictive.

Figure 1:
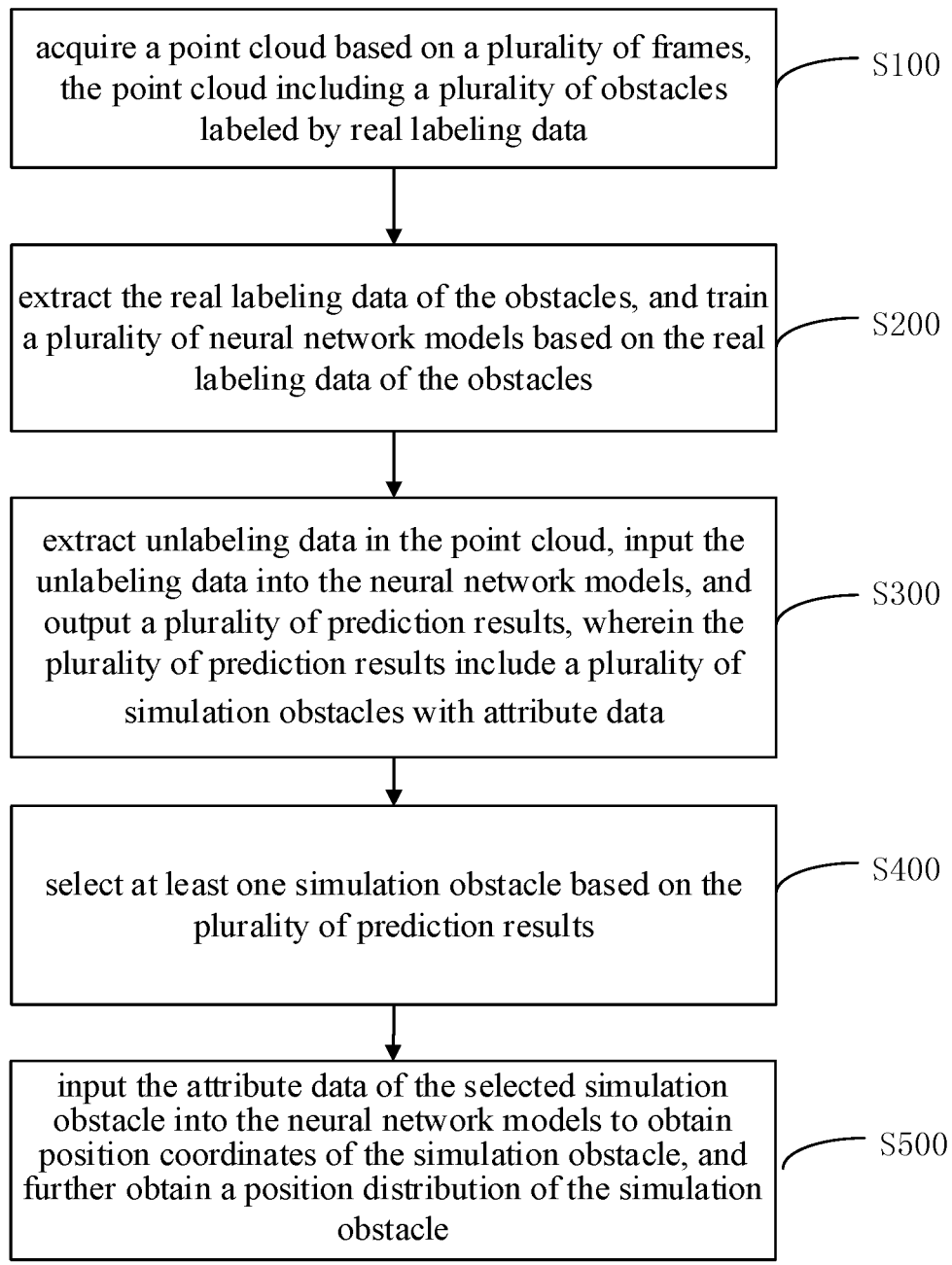
FIG. 1 is a flowchart depicting an obstacle distribution simulation method based on multiple models according to an embodiment of the present disclosure.

FIG. 1 is a flowchart depicting an obstacle distribution simulation method based on multiple models. At S100, a point cloud based on a plurality of frames can be acquired, the point cloud can include a plurality of obstacles labeled by real labeling data.

When an acquisition vehicle moves according to a movement rule, the acquisition vehicle may obtain a point cloud based on a plurality of frames, by scanning the surrounding obstacles using radar, or other sensing techniques. The acquisition vehicle may move along a main road or along a specified side road, and various movements of the acquisition vehicle will fall within the scope of embodiments of the present disclosure. The point cloud may also be obtained directly from the outside.

At S200, the real labeling data of the obstacles can be extracted, and a plurality of neural network models can be trained based on the real labeling data of the obstacles.

The obstacles in each frame of the point cloud can be labeled based on absolute coordinates of the obstacles, such that each obstacle has corresponding real labeling data. Specifically, in embodiments, the absolute coordinates of the acquisition vehicle in the world coordinate system can be acquired. In each frame of the point cloud, a point cloud coordinate system can be established by taking the acquisition vehicle as the origin, and the relative coordinates of each obstacle with respect to the acquisition vehicle can be calculated. Based on the absolute coordinates of the acquisition vehicle and the relative coordinates of the obstacle, the absolute coordinates of the obstacle in the world coordinate system can be obtained. The obstacle can be labeled based on the absolute coordinates of the obstacle such that the real labeling data of the obstacle includes the absolute coordinates of the obstacle. Multiple neural network models can be designed based on the real labeling data of the obstacles. The multiple neural network models can have the same function, but may have different network structures and different parameters. Common network structures can include VGG-net (Visual Geometry Group), ResNet (Deep residual network) GoogleNet, and the like. The parameters can correspond to the network structures.

At S300, unlabeled data in the point cloud can be extracted, the unlabeled data can be input into the neural network models, and a plurality of prediction results can be output. The plurality of prediction results can include a plurality of simulated obstacles with attribute data.

Not all the obstacles are labeled in each frame of the point cloud, and the unlabeled obstacles each have absolute coordinates, which constitute unlabeled data in the point cloud. The unlabeled data can be input into multiple neural network models to predict the simulated obstacles. The attribute data of each of the simulated obstacles can include an identity recognition ID, a type, an orientation of the simulated obstacle, and on the like. It should be noted that the prediction results obtained from different neural network models may be different. That is, the number, the type, and so on of the simulated obstacles may be different in different prediction results.

At S400, at least one simulated obstacle can be selected based on the plurality of prediction results.

At S500, the attribute data of the selected simulated obstacle can be input into the neural network models to obtain position coordinates of the simulated obstacle, and to further obtain a position distribution of the simulated obstacle.

As a result of executing the methods of embodiments of the present disclosure, the position diversity of the simulated obstacles can be increased, such that a simulated result of the position distribution of the simulated obstacles and a simulated result of the number distribution of the simulated obstacles are closer to real conditions.

In an embodiment, after outputting a plurality of prediction results, the method can further includes outputting confidences corresponding to the respective prediction results, determining whether the confidences are greater than a threshold, and retaining prediction results with confidences greater than the threshold.

The confidence for each prediction result can be output by the neural network model. The confidence can be used to indicate reliability of the prediction result. The confidence corresponding to the prediction result is determined, a prediction result with a confidence greater than the threshold can be retained, and the prediction result having a confidence less than the threshold can be discarded.

In an embodiment, selecting at least one simulated obstacle based on the plurality of prediction results can include determining whether the plurality of prediction results includes a common simulated obstacle, and selecting the common simulated obstacle when the plurality of prediction results includes the common simulated obstacle.

By way of example, the neural network models might include a first model, a second model and a third model. The unlabeled data can be input into each of the first model, the second model, and the third model to obtain attribute A data, attribute B data, and attribute C data respectively. If the attribute A data, attribute B data, and attribute C data all indicate the same obstacle X, the obstacle X is selected as a simulated obstacle. Alternatively, if the number of prediction results which indicate the same obstacle is greater than or equal to a threshold number, the obstacle is selected as the simulated obstacle. For example, if both the attribute A data and the attribute B data indicate another obstacle Y, and the threshold number is 2, then the obstacle Y is selected as a simulated obstacle.

In an embodiment, obtaining the position coordinates of each of the simulated obstacles according to the neutral network models can include inputting the attribute data of the selected simulated obstacle into the neural network models to obtain position coordinates of the simulated obstacle. This can include inputting the attribute data of the selected simulated obstacle into the neural network models to obtain a plurality of boundary boxes of the simulated obstacle, obtaining lengths and widths of the boundary boxes of the simulated obstacle, calculating an average length value and an average width value based on the lengths and widths of the boundary boxes. Center coordinates of an average boundary box can be determined based on the average length value and the average width value, to cause the center coordinates to be represented as position coordinates of the simulated obstacle.

Figure 2:
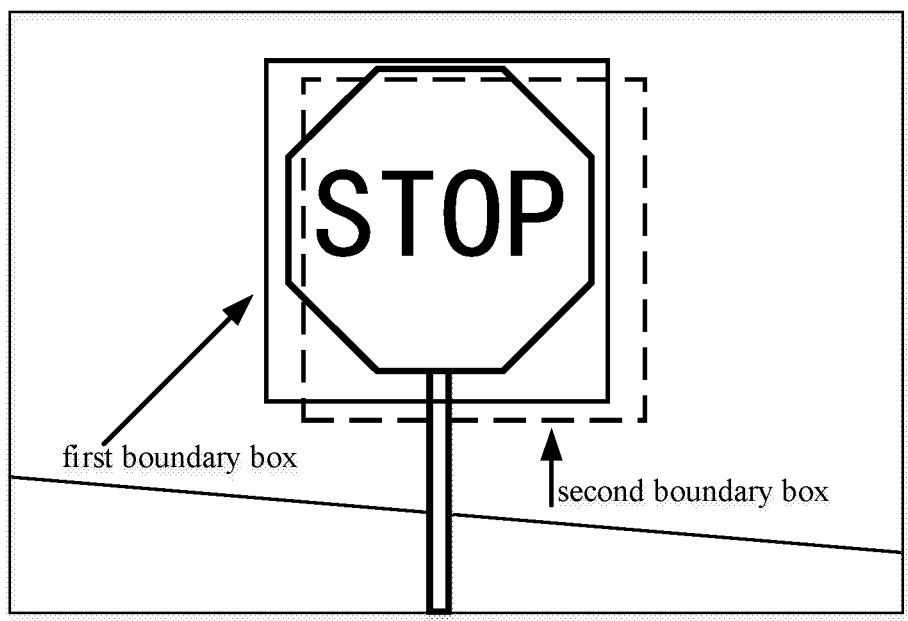
FIG. 2 is a schematic diagram depicting a boundary box of a simulated obstacle according to an embodiment of the present disclosure.

As shown in FIG. 2, a "STOP" simulated obstacle is provided as an illustrative example. A first boundary box and a second boundary box for the "STOP" simulated obstacle are acquired by calculation of two neural network models. The position coordinates of the simulated obstacle are calculated using the first boundary box and the second boundary box.

Figure 3:
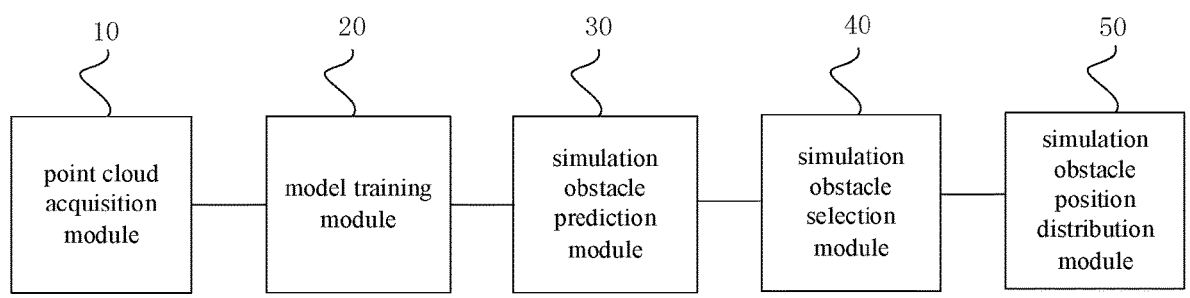
FIG. 3 is a block diagram depicting the structure of an obstacle distribution simulation device according to an embodiment of the present disclosure.

FIG. 3 is a schematic diagram depicting an obstacle distribution simulation device based on multiple models according to an embodiment. A point cloud acquisition module 10 can be configured to acquire a point cloud based on a plurality of frames. The point cloud can include a plurality of obstacles labeled with real labeling data.

A model training module 20 can be configured to extract the real labeling data of the obstacles, and to train a plurality of neural network models based on the real labeling data of the obstacles.

A simulated obstacle prediction module 30 can be configured to extract unlabeled data in the point cloud, input the unlabeled data into the neural network models, and output a plurality of prediction results. The plurality of prediction results can include a plurality of simulated obstacles with attribute data.

A simulated obstacle selection module 40 can be configured to select at least one simulated obstacle based on the plurality of prediction results.

A simulated obstacle position distribution module 50 can be configured to input the attribute data of the selected simulated obstacle into the neural network models to obtain position coordinates of the simulated obstacle, and further obtain a position distribution of the simulated obstacle.

In embodiments, the device can further include a confidence determination module (not shown). The confidence determination module can be configured to output confidences corresponding to the respective prediction results, determine whether the confidences are greater than a threshold, and retain prediction results with confidences greater than the threshold.

Figure 4:
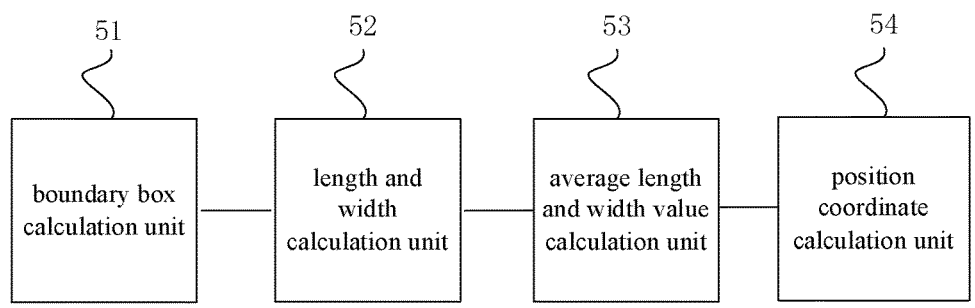
FIG. 4 is a block diagram depicting the structure of a simulated obstacle position distribution module according to an embodiment of the present disclosure.

In embodiments, as shown in FIG. 4, the simulated obstacle position distribution module 50 can include a number of sub units. A boundary box calculation unit 51 can be configured to input the attribute data of the selected simulated obstacle into the neural network models to obtain a plurality of boundary boxes of the simulation obstacle. A length and width calculation unit 52 can be configured to obtain lengths and widths of the boundary boxes of the simulation obstacle. An average length and width value calculation unit 53 can be configured to calculate an average length value and an average width value based on the lengths and widths of the boundary boxes. A position coordinate calculation unit 54 can be configured to obtain center coordinates of an average boundary box based on the average length value and the average width value, to cause the center coordinates to be represented as position coordinates of the simulated obstacles.

Figure 5:
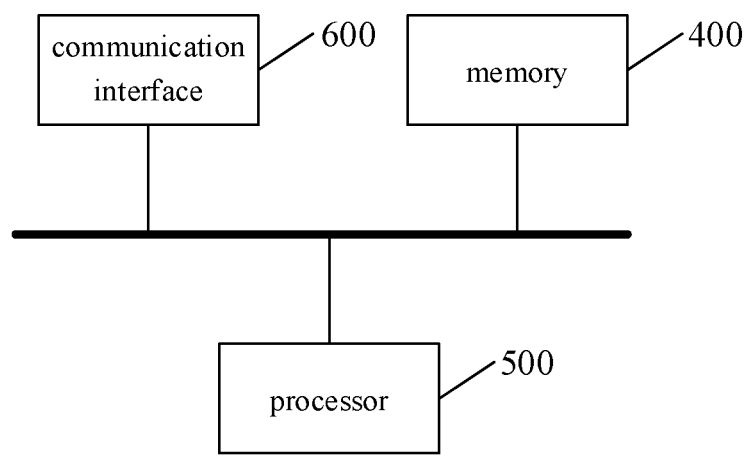
FIG. 5 is a schematic diagram of an obstacle distribution simulation terminal based on multiple models according to an embodiment of the present disclosure.

FIG. 5 is a schematic diagram depicting a terminal for obstacle distribution simulation based on multiple models is provided according to an embodiment of the present disclosure.

The terminal can include a memory 400 and a processor 500, wherein a computer program that can run on the processor 500 is stored in the memory 400. When the processor 500 executes the computer program, the obstacle distribution simulation method based on multiple models according to the above embodiment is implemented. There may be one or more of each of memory 400 and processor 500 in the terminal.

A communication interface 600 can be configured to enable the memory 400 and the processor 500 to communicate with an external device.

The memory 400 may include a high-speed RAM memory, or may also include a non-volatile memory, such as at least one disk memory.

If the memory 400, the processor 500 and the communication interface 600 are implemented independently, the memory 400, the processor 500 and the communication interface 600 may be connected to each other via a bus so as to realize mutual communication. The bus may be an industry standard architecture (ISA) bus, a peripheral component interconnect (PCI) bus, an extended industry standard architecture (EISA) bus, or the like. The bus may be categorized into an address bus, a data bus, a control bus, or the like. For ease of illustration, only one bold line is shown in FIG. 5 to represent the bus, but it does not mean that there is only one bus or only one type of bus.

Optionally, in embodiments, if the memory 400, the processor 500 and the communication interface 600 are integrated on one chip, then the memory 400, the processor 500 and the communication interface 600 can complete mutual communication through an internal interface.

An embodiment of the present disclosure provides a non-transitory computer readable storage medium having a computer program stored thereon which, when executed by a processor, implements the obstacle distribution simulation method based on multiple models described in any of the above embodiments.

In the present specification, the description referring to the terms "one embodiment", "some embodiments", "an example", "a specific example", or "some examples" or the like means that the specific features, structures, materials, or characteristics described in connection with the embodiment or example are contained in at least one embodiment or example of the present disclosure. Moreover, the specific features, structures, materials, or characteristics described may be combined in a suitable manner in any one or more of the embodiments or examples. In addition, various embodiments or examples described in the specification as well as features of different embodiments or examples may be united and combined by those skilled in the art, as long as they do not contradict with each other.

Furthermore, terms "first" and "second" are used for descriptive purposes only, and are not to be construed as indicating or implying relative importance or implicitly indicating the number of recited technical features. Thus, a feature defined with "first" and "second" may include at least one said feature, either explicitly or implicitly. In the description of the present disclosure, the meaning of "a plurality" is two or more than two, unless otherwise explicitly or specifically indicated.

Any process or method described in the flowcharts or described otherwise herein may be construed as representing a module, segment or portion including codes for executing one or more executable instructions for implementing particular logical functions or process steps. The scope of the preferred embodiments of the present disclosure includes additional implementations in which functions may be implemented in an order that is not shown or discussed, including in a substantially concurrent manner or in a reverse order based on the functions involved. All these should be understood by those skilled in the art to which the embodiments of the present disclosure belong.

The logics and/or activities represented in the flowcharts or otherwise described herein for example may be considered to be an ordered list of executable instructions for implementing logical functions. They can be specifically embodied in any computer readable medium for use by an instruction execution system, apparatus or device (e.g., a computer-based system, a system including a processor, or another system that can obtain instructions from the instruction execution system, apparatus or device and execute these instructions) or for use in conjunction with the instruction execution system, apparatus or device. For the purposes of the present specification, "computer readable medium" can be any means that can contain, store, communicate, propagate or transmit programs for use by an instruction execution system, apparatus or device or for use in conjunction with the instruction execution system, apparatus or device. More specific examples (non-exhaustive list) of computer readable storage medium at least include: electrical connection parts (electronic devices) having one or more wires, portable computer disk cartridges (magnetic devices), random access memory (RAM), read only memory (ROM), erasable programmable read-only memory (EPROM or flash memory), fiber optic devices, and portable read only memory (CDROM). In addition, the computer-readable storage medium may even be a paper or other suitable medium on which the programs can be printed. This is because for example the paper or other medium can be optically scanned, followed by editing, interpretation or, if necessary, other suitable ways of processing so as to obtain the programs electronically, which are then stored in a computer memory.

It should be understood that individual portions of the present disclosure may be implemented in the form of hardware, software, firmware, or a combination thereof. In the above embodiments, a plurality of steps or methods may be implemented using software or firmware stored in a memory and executed by a suitable instruction execution system. For example, if they are implemented in hardware, as in another embodiment, any one or a combination of the following techniques known in the art may be used: discrete logic circuits having logic gate circuits for implementing logic functions on data signals, application-specific integrated circuits having suitable combined logic gate circuits, programmable gate arrays (PGA), field programmable gate arrays (FPGA), etc.

Those skilled in the art may understand that all or part of the steps carried in the method of the foregoing embodiments may be implemented by using a program to instruct the relevant hardware, and the program may be stored in a computer readable storage medium. When executed, the program includes one or a combination of the steps in the method embodiments.

In addition, individual functional units in various embodiments of the present disclosure may be integrated in one processing module, or individual units may also exist physically and independently, or two or more units may also be integrated in one module. The above integrated module can be implemented in the form of hardware or in the form of a software functional module. The integrated module may also be stored in a computer readable storage medium if it is implemented in the form of a software function module and sold or used as a stand-alone product. The storage medium may be a read-only memory, a magnetic disk or an optical disk, etc.

The above description only relates to specific embodiments of the present disclosure, but the scope of protection of the present disclosure is not limited thereto, and any of those skilled in the art can readily contemplate various changes or replacements within the technical scope of the present disclosure. All these changes or replacements should be covered by the scope of protection of the present disclosure. Therefore, the scope of protection of the present disclosure should be determined by the scope of the appended claims.

What is claimed is:

1. An obstacle distribution simulation method based on multiple models, comprising:
   acquiring a point cloud based on a plurality of frames, the point cloud comprising a plurality of obstacles labeled with real labeling data;
   extracting the real labeling data of the plurality of obstacles, and training a plurality of neural network models based on the real labeling data of the plurality of obstacles;
   extracting unlabeled data of unlabeled obstacles from the point cloud, inputting the unlabeled data into the plurality of neural network models, and outputting, for the unlabeled data, a plurality of prediction results obtained by the plurality of neural network models, wherein the plurality of prediction results comprise a plurality of simulated obstacles with attribute data;
   selecting a simulated obstacle based on the plurality of prediction results; and
   inputting the attribute data of the selected simulated obstacle into the plurality of neural network models to obtain position coordinates of the simulated obstacle using the plurality of neural network models, and further obtain a position distribution of the simulated obstacle using the plurality of neural network models.

2. The method of claim 1, further comprising:
   outputting confidences corresponding to the respective prediction results; and
   determining whether the confidences are greater than a threshold, and reserving a prediction result with a confidence greater than the threshold.

3. The method of claim 1, wherein selecting at least one simulated obstacle based on the plurality of prediction results comprises:
   determining whether the plurality of prediction results comprise a common simulated obstacle, and selecting the common simulated obstacle when the plurality of prediction results comprise the common simulated obstacle.

4. The method of claim 1, wherein inputting the attribute data of the selected simulated obstacle into the plurality of neural network models to obtain position coordinates of the simulated obstacle comprises:
   inputting the attribute data of the selected simulated obstacle into the plurality of neural network models to obtain a plurality of boundary boxes of the simulated obstacle;
   obtaining a length and a width of the each of the plurality of boundary boxes of the simulated obstacle;
   calculating an average length value and an average width value based on the lengths and widths of the plurality of boundary boxes; and
   calculating center coordinates of an average boundary box based on the average length value and the average width value such that the center coordinates are represented as position coordinates of the simulated obstacle.

5. An obstacle distribution simulation device based on multiple models, the device comprising:
   one or more processors; and
   a storage device configured to store one or more programs, that, when executed by the one or more processors, cause the one or more processors to:
   acquire a point cloud based on a plurality of frames, the point cloud comprising a plurality of obstacles labeled by real labeling data;
   extract the real labeling data of the plurality of obstacles, and train a plurality of neural network models based on the real labeling data of the plurality of obstacles;
   extract unlabeled data of unlabeled obstacles from the point cloud, input the unlabeled data into the plurality of neural network models, and output, for the unlabeled data, a plurality of prediction results obtained by the plurality of neural network models, wherein the plurality of prediction results comprise a plurality of simulated obstacles with attribute data;
   select a simulated obstacle based on the plurality of prediction results; and
   input the attribute data of the selected simulated obstacle into the plurality of neural network models to obtain position coordinates of the simulated obstacle using the plurality of neural network models, and to further obtain a position distribution of the simulated obstacle using the plurality of neural network models.

6. A non-transitory computer readable storage medium, in which a computer program is stored, wherein the program, when executed by a processor, causes the processor to implement the method of claim 1.

7. The device of claim 5, wherein the one or more programs, when executed by the one or more processors, cause the one or more processors further to:
   output a confidence corresponding to the each of the plurality of prediction results;
   determine whether each confidence is greater than a threshold;
   and retain each prediction result having a confidence greater than the threshold.

8. The device of claim 5, wherein the one or more programs, when executed by the one or more processors, cause the one or more processors further to:
   input the attribute data of the selected simulated obstacle into the plurality of neural network models to obtain a plurality of boundary boxes of the simulated obstacle;
   obtain lengths and widths of the plurality of boundary boxes of the simulated obstacle;
   calculate an average length value and an average width value based on the lengths and widths of the plurality of boundary boxes; and
   calculate center coordinates of an average boundary box based on the average length value and the average width value, such that the center coordinates are represented as position coordinates of the simulated obstacle.

* * * * *